(12) United States Patent
Miyazaki

(10) Patent No.: US 11,888,466 B2
(45) Date of Patent: Jan. 30, 2024

(54) ELECTRONIC CIRCUITRY, METHOD, ELECTRONIC SYSTEM AND NON-TRANSITORY COMPUTER READABLE MEDIUM

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Koutaro Miyazaki, Taito (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 133 days.

(21) Appl. No.: 17/653,582

(22) Filed: Mar. 4, 2022

(65) Prior Publication Data
US 2023/0086132 A1 Mar. 23, 2023

(30) Foreign Application Priority Data
Sep. 14, 2021 (JP) .................. 2021-149693

(51) Int. Cl.
*H03K 17/08* (2006.01)
*G05F 1/56* (2006.01)
(Continued)

(52) U.S. Cl.
CPC .......... *H03K 17/08* (2013.01); *H02H 1/0007* (2013.01); *H03K 5/24* (2013.01); *G05F 1/562* (2013.01);
(Continued)

(58) Field of Classification Search
CPC .......... G05F 1/562; G05F 1/573; H03K 17/08
See application file for complete search history.

(56) References Cited

U.S. PATENT DOCUMENTS 10,126,353 B2  11/2018 Bacigalupo et al.
10,263,412 B2   4/2019 Huber
(Continued)

OTHER PUBLICATIONS

Chen et al., "An Improved IGBT Short-Circuit Protection Method With Self-Adaptive Blanking Circuit Based on $V_{CE}$ Measurement", IEEE Transactions on Power Electronics, vol. 33 No. 7, Jul. 2018, 11 Pages.

(Continued)

*Primary Examiner* — Gary A Nash
(74) *Attorney, Agent, or Firm* — Oblon, McClelland, Maier & Neustadt, L.L.P.

(57) ABSTRACT

According to one embodiment, electronic circuitry includes: a detection circuit including a diode, a cathode side of the diode being connected to one end of a semiconductor switching element and an anode side of the diode being connected to a first node; a comparator circuit configured to compare a voltage of the first node and a threshold voltage and generate a first signal; a first filter connected between the first node and another end of the semiconductor switching element and configured to suppress the voltage of the first node in a first period based on a control signal indicating turn-on of the semiconductor switching element; and a control circuit configured to determine at least one of the threshold voltage and the first period based on the first signal.

21 Claims, 15 Drawing Sheets

(51) Int. Cl.
  *G05F 1/573* (2006.01)
  *H02H 1/00* (2006.01)
  *H03K 5/24* (2006.01)
  *H03K 5/00* (2006.01)

(52) U.S. Cl.
  CPC .... *G05F 1/573* (2013.01); *H03K 2005/00013* (2013.01)

(56) References Cited

U.S. PATENT DOCUMENTS

| | | | |
|---|---|---|---|
| 10,601,415 B2 | 3/2020 | Norling et al. | |
| 2006/0077000 A1* | 4/2006 | Goudo | F02P 3/051 327/434 |
| 2007/0070567 A1 | 3/2007 | Bayerer et al. | |
| 2014/0368255 A1* | 12/2014 | Hayasaka | H03K 17/08104 327/427 |
| 2015/0326009 A1 | 11/2015 | Mari Curbelo et al. | |
| 2015/0380926 A1* | 12/2015 | Zhong | H03K 17/0828 361/86 |
| 2016/0241145 A1* | 8/2016 | Matsuura | H02M 1/14 |
| 2017/0122996 A1 | 5/2017 | Sullivan | |
| 2018/0013415 A1* | 1/2018 | Ikeda | H03K 17/08142 |
| 2018/0183228 A1 | 6/2018 | Huber | |
| 2020/0228109 A1* | 7/2020 | Bachhuber | H03K 17/0822 |
| 2020/0287533 A1* | 9/2020 | Kawai | H03K 17/04206 |
| 2021/0021121 A1 | 1/2021 | Lee et al. | |

OTHER PUBLICATIONS

Toshiba Device & Storage Incorporated Company, "Smart gate driver coupler TLP5214 A/TLP5214", Photocoupler Application Note, Mar. 30, 2018, 45 Pages (with English translation).

* cited by examiner

ELECTRONIC CIRCUITRY, METHOD, ELECTRONIC SYSTEM AND NON-TRANSITORY COMPUTER READABLE MEDIUM

CROSS REFERENCE TO RELATED APPLICATIONS

This application is based upon and claims the benefit of priority from the prior Japanese Patent Application No. 2021-149693, filed on Sep. 14, 2021, the entire contents of which are incorporated herein by reference.

FIELD

The present embodiment relates to electronic circuitry, a method, an electronic system and a non-transitory computer readable medium.

BACKGROUND

When an overcurrent flows to a power device such as an IGBT (Insulated Gate Bipolar Transistor) used in an inverter circuit or the like, since there is a possibility of destroying the power device, the overcurrent requires to be cut off in a short time. A function of protection from a short-circuit by detecting an overcurrent state from a voltage between output terminals and automatically cutting off a gate of the power device is called a DESAT (Desaturation) function.

As a configuration method of a circuit (DESAT protective circuit) which executes the DESAT function, a circuit configuration requires to be adjusted while exchanging an exterior resistor and an exterior capacitor such that various power devices and substrates are appropriately protected. Therefore, when incorporating the DESAT protective circuit in an evaluation system and performing an evaluation test of the DESAT protective circuit, time and labor of disassembling the evaluation system, exchanging parts and assembling the evaluation system again are required every time of adjustment.

DETAILED DESCRIPTION

Figure 1:
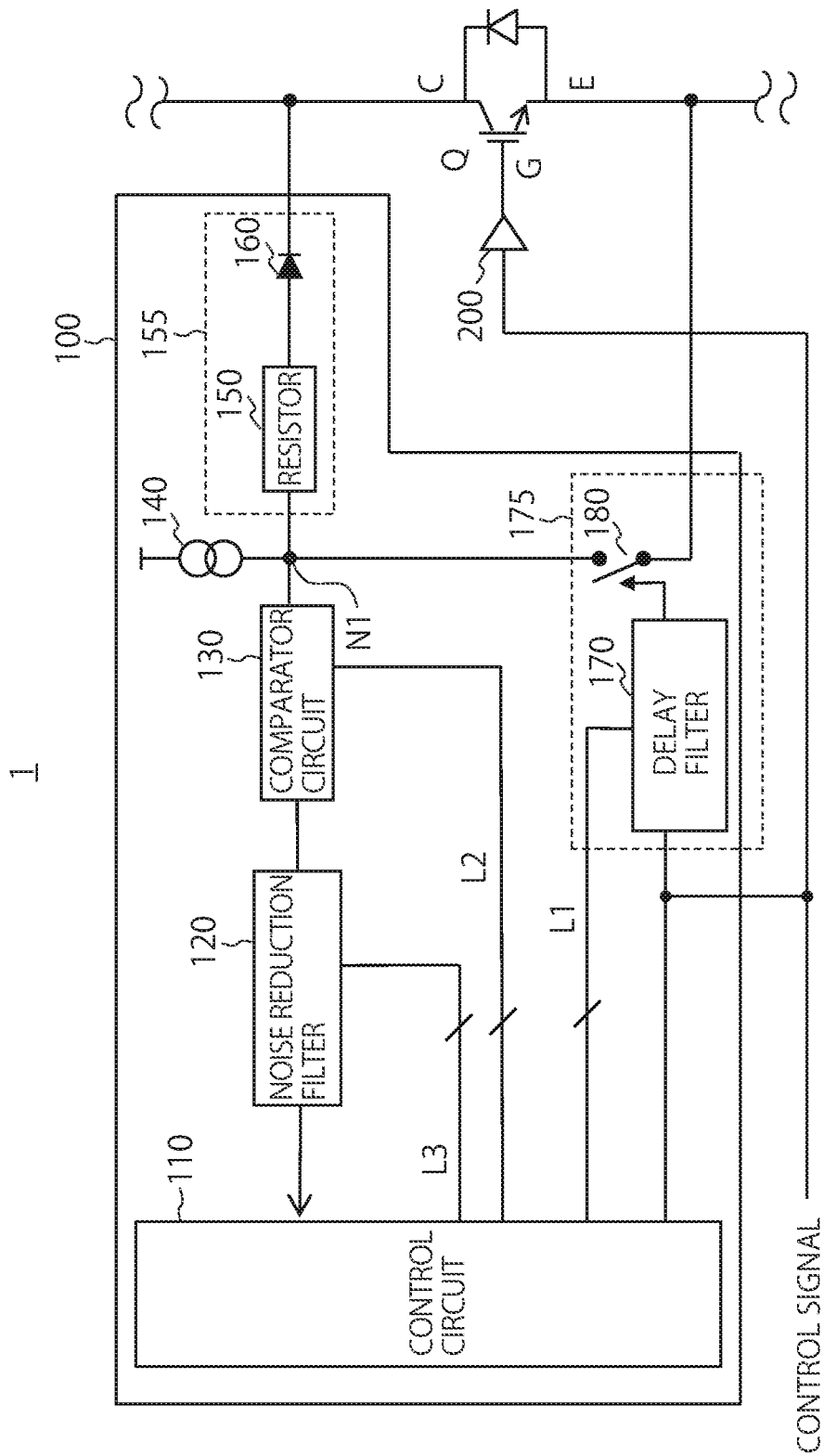
FIG. 1 is a block diagram of electronic circuitry relating to an embodiment of the present invention.

According to one embodiment, electronic circuitry includes: a detection circuit including a diode, a cathode side of the diode being connected to one end of a semiconductor switching element and an anode side of the diode being connected to a first node; a comparator circuit configured to compare a voltage of the first node and a threshold voltage and generate a first signal; a first filter connected between the first node and another end of the semiconductor switching element and configured to suppress the voltage of the first node in a first period based on a control signal indicating turn-on of the semiconductor switching element; and a control circuit configured to determine at least one of the threshold voltage and the first period based on the first signal.

Hereinafter, an embodiment of the present invention will be described with reference to the drawings. A same number is attached to a same component in the drawings and description is appropriately omitted.

FIG. 1 is a block diagram of electronic circuitry 1 relating to the present embodiment. The electronic circuitry 1 includes a semiconductor switching element Q and a protective circuit 100 which protects the semiconductor switching element Q from an overcurrent. To a control terminal of the semiconductor switching element Q, a buffer element 200 is connected. The buffer element 200 has a function of buffering a control signal inputted from an external circuit or a control circuit 110 to the control terminal. Note that the buffer element 200 may be omitted. As an example of the buffer element 200, an amplifier which amplifies an input current to 1× or more may be used.

The semiconductor switching element Q is a transistor which drives a load device (not shown) by a switching operation. In the present embodiment, the semiconductor switching element Q is an IGBT. At the IGBT, a diode 210 which prevents a back current is connected between an emitter (E) and a collector (C). The semiconductor switching element Q may be some other power device such as a power MOSFET, a bipolar transistor and a thyristor. The collector of the semiconductor switching element Q is connected to a predetermined node and the emitter is connected to a reference voltage. The emitter may be connected to some other voltage other than the reference voltage. The predetermined node is, for example, a power supply voltage or a terminal of some other transistor or the like (for example, a collector of another IGBT).

The semiconductor switching element Q receives the control signal indicating ON at a control terminal (gate) from the external circuit or the control circuit 110. When a gate voltage (gate-emitter voltage) becomes a threshold voltage or higher, the semiconductor switching element Q is turned ON. When input of the control signal is started (when a turn-on operation is started), since the collector and the emitter are not conducted, a collector-emitter voltage is a high voltage, and is larger than the threshold voltage to be a reference of protective operation start to be described later. As the gate voltage rises, the collector-emitter voltage becomes low, the collector and the emitter are conducted by turn-on, and the collector-emitter voltage is reduced. A current (collector current) determined according to the collector-emitter voltage and a parasitic inductor or the like flows through the semiconductor switching element Q.

The protective circuit 100 includes the control circuit 110, a noise reduction filter 120, a comparator circuit 130, a current source 140, a detection circuit 155 (resistor 150, diode 160) and a blanking filter 175 (first filter). The blanking filter 175 includes a delay filter 170 and a discharge switch 180.

The detection circuit 155 uses the diode 160 and the resistor 150 to detect a collector voltage of the semiconductor switching element Q. A cathode side of the diode 160 is connected to the collector of the semiconductor switching element Q. Thus, input of the current from the collector of the semiconductor switching element Q is prevented. A node between the detection circuit 155 and the comparator circuit 130 is a node N1. A terminal on an anode side of the diode 160 is connected to the node N1 via the resistor 150. A configuration of omitting the resistor 150 is also possible. Note that "being connected" includes not only "being actually connected" but also "being connectable".

To the node N1, the current source 140 is connected. The current source 140 provides a fixed current. The current source 140 is connected to the emitter of the semiconductor switching element Q via the discharge switch 180. The current source 140 is configured using an NMOS transistor or a PMOS transistor as an example.

The discharge switch 180 is a switch which connects the node N1 and the emitter of the semiconductor switching element Q. The discharge switch 180 is a PMOS transistor or an NMOS transistor for example. However, the discharge switch 180 may be a transistor of another kind such as a bipolar transistor or may be a circuit other than the transistor. One end of the discharge switch 180 is electrically connected to the emitter of the semiconductor switching element Q. The other end of the discharge switch 180 is connected to the node N1. The control terminal of the discharge switch is connected to an output terminal of the delay filter 170. The discharge switch 180 receives a delayed control signal from the delay filter 170.

The discharge switch 180 is ON while the control signal is not inputted. That is, the discharge switch 180 is ON while the semiconductor switching element Q is in an OFF state. At the time, a voltage of the node N1 is fixed to the voltage according to an emitter voltage of the semiconductor switching element Q. The emitter voltage is the voltage sufficiently lower than the threshold voltage which may be used in the comparator circuit 130. When the control signal is inputted, the discharge switch 180 is turned OFF. When the discharge switch 180 is turned OFF, at the node N1, the voltage according to the emitter-collector voltage appears via the diode 160 and the resistor 150.

The blanking filter 175 is a filter (first filter) which suppresses the voltage inputted to the comparator circuit 130 or the voltage of the node N1 when the turn-on operation of the semiconductor switching element Q is started. The blanking filter 175 prevents the voltage of the node N1 from becoming the threshold voltage or higher before the semiconductor switching element Q is turned ON. Thus, at the time of the turn-on operation, a protective operation is prevented from being started by erroneous detection of the overcurrent. The control signal of the semiconductor switching element Q from the external circuit or the control circuit 110 is inputted to the gate of the semiconductor switching element Q and is also simultaneously inputted to the blanking filter 175.

The delay filter 170 delays the control signal by set time (delay time) and provides the control signal to the control terminal of the discharge switch 180. The discharge switch 180 is turned OFF with the delay of the delay time after the control signal is inputted to the control terminal of the semiconductor switching element Q.

Figure 2:
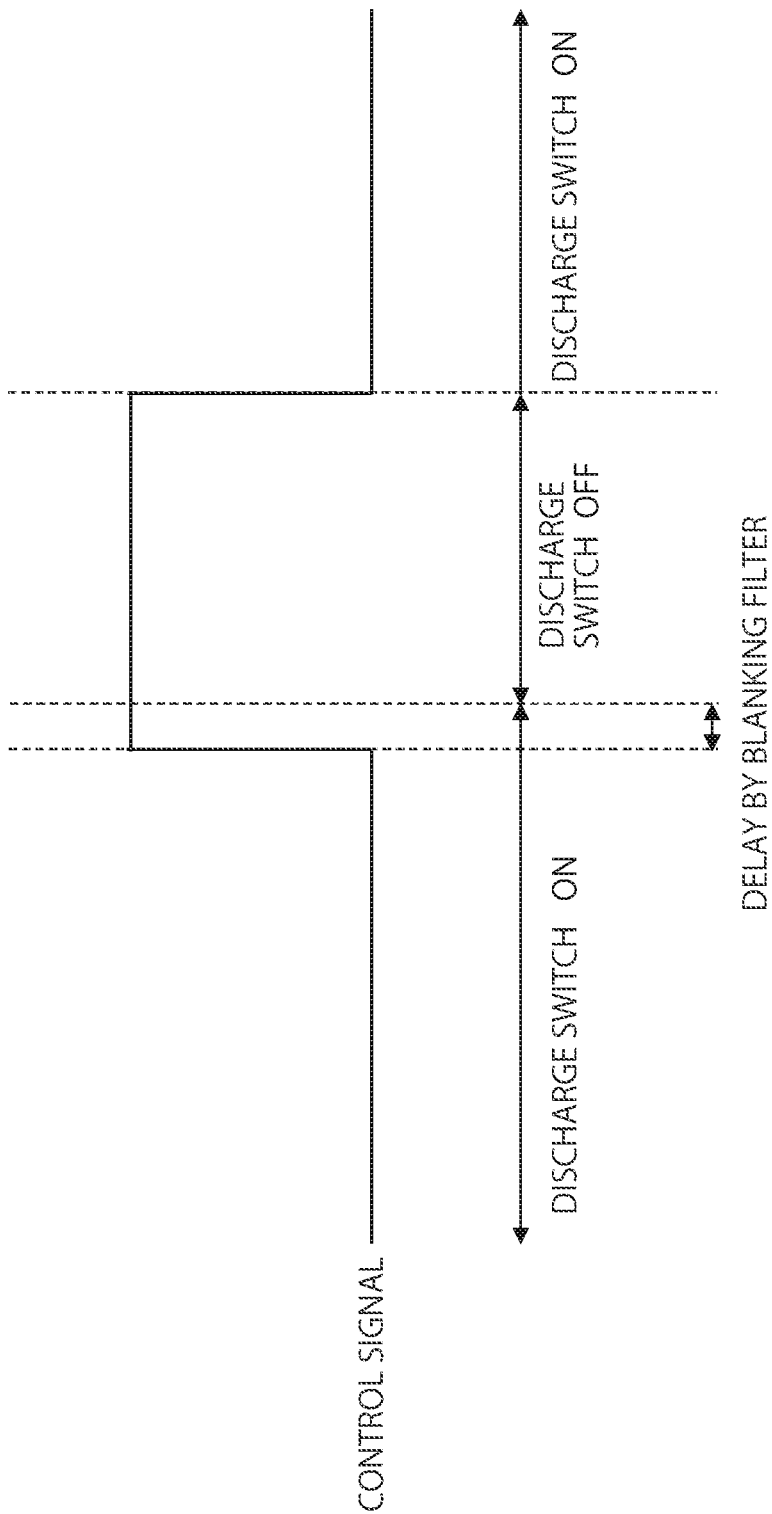
FIG. 2 is a diagram illustrating a relation between a control signal of a semiconductor switching element and an ON/OFF state of a discharge switch.

FIG. 2 illustrates a relation between the control signal of the semiconductor switching element Q and an ON/OFF state of the discharge switch 180. The discharge switch 180 is turned OFF with the delay from rise of the control signal.

After the discharge switch 180 receives the control signal, the discharge switch 180 is ON in a first period, and the voltage of the node N1 is suppressed. That is, the voltage of the node N1 is fixed to the emitter voltage. The first period is, for example, a blanking period until the collector-emitter voltage of the semiconductor switching element Q sufficiently lowers. The first period includes at least a period until the semiconductor switching element Q is turned ON, for example. When supply of the control signal to the semiconductor switching element Q is started, as described above, the collector-emitter voltage is high and is normally the threshold voltage which may be used in the comparator circuit 130 or higher. Therefore, when the collector-emitter voltage is outputted to the node N1 at the start of the turn-on operation, the overcurrent is erroneously detected in the comparator circuit 130. A result of the erroneous detection is inputted to the control circuit 110 via the noise reduction filter 120, the control signal indicating OFF is outputted from the control circuit 110 by the operation of a protective function and the semiconductor switching element Q is turned OFF.

Accordingly, by keeping the discharge switch 180 ON in the blanking period (first period) until the collector-emitter voltage becomes sufficiently low after the turn-on operation of the semiconductor switching element Q is started, the node N1 is fixed to the emitter voltage. By turning the discharge switch 180 OFF after the collector-emitter voltage becomes low (after the semiconductor switching element Q is turned ON for example), the voltage appears according to the collector-emitter voltage at the node N1. In such a manner, the erroneous detection of the overcurrent at the time of the turn-on operation is prevented. Note that, at the time of an evaluation test of the present embodiment, the control circuit 110 is set so that the protective function is not operated in the case where the erroneous detection of the overcurrent described above occurs.

By adjusting the delay time of the delay filter 170, the period of fixing a potential of the node N1 after the control signal is received in the semiconductor switching element Q, in other words, the period (first period) until the potential of the node N1 is made to start following the collector-emitter voltage can be controlled. When the delay time is too long, since there is a possibility of exceeding allowable time until detection of the overcurrent when the overcurrent is generated at the time of an actual activation operation, the delay time requires to be set at a value of the allowable time or smaller. On the other hand, when the delay time is too short, the erroneous detection of the overcurrent described above may occur.

The delay time to be set to the delay filter 170 is variable by an adjustment signal (delay adjustment signal) from the control circuit 110. The delay adjustment signal from the control circuit 110 is inputted via a signal line L1. The delay adjustment signal is a digital signal but can be an analog signal. In the case of receiving the delay adjustment signal from the control circuit 110, the delay filter 170 sets the delay time based on the delay adjustment signal. The delay time corresponds to the time that the delay filter 170 or the blanking filter 175 delays the control signal or the blanking period (first period) described above.

Figure 3:
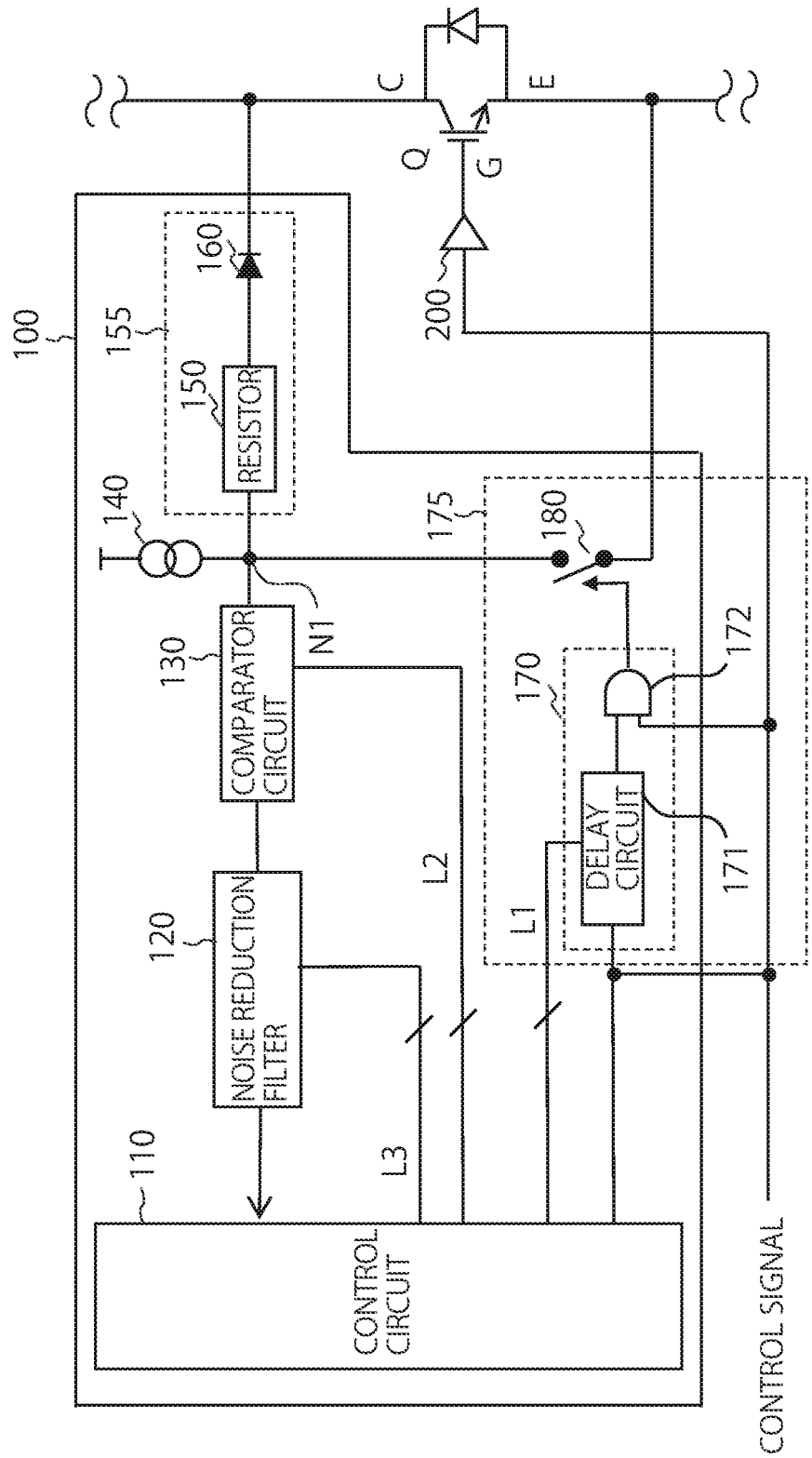
FIG. 3 is a diagram illustrating a specific example of a blanking filter.

FIG. 3 illustrates a specific example of the delay filter 170. The delay filter 170 includes a digitally controllable delay circuit 171 and an AND circuit (AND logic circuit) 172. The delay time of the delay circuit 171 is adjustable by the delay adjustment signal from the control circuit 110. The control signal from the external circuit or the control circuit 110 is inputted to the delay circuit 171 and the AND circuit 172. The delay circuit 171 outputs the control signal with the delay of the set time. In the case where both of the delayed control signal and the control signal from the external circuit or the control circuit 110 are inputted, the AND circuit 172 outputs the control signal which indicates OFF to the discharge switch 180. Thus, the control signal is inputted to the discharge switch 180 with the delay of the delay time set in the delay circuit 171 from a timing at which the control signal is inputted to the semiconductor switching element Q from the external circuit or the control circuit 110.

Figure 4:
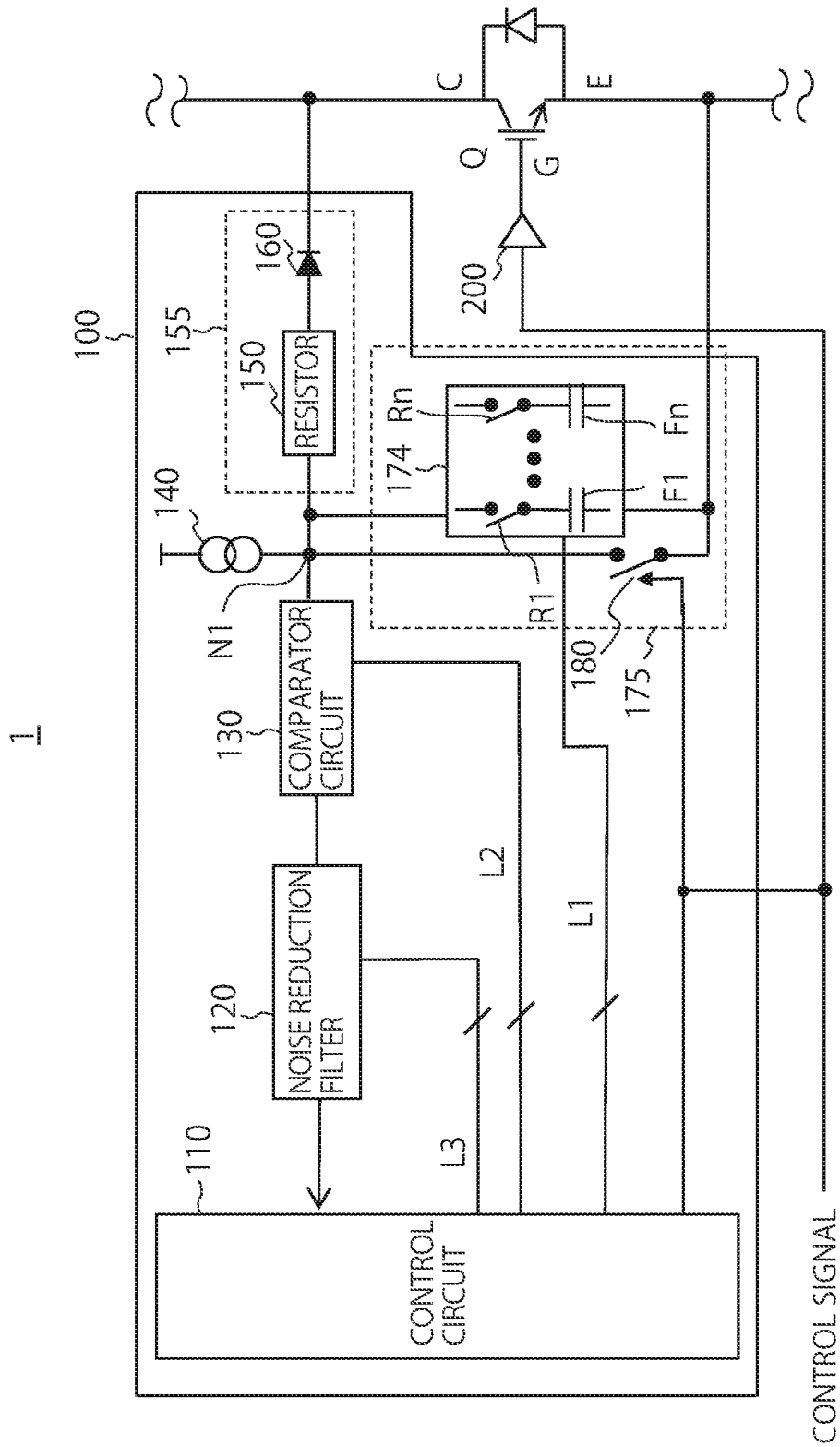
FIG. 4 is a diagram illustrating another specific example of the blanking filter.

FIG. 4 illustrates another specific example of the blanking filter 175. To the control terminal of the discharge switch 180, the control signal is directly inputted. Between the node N1 and one end of the discharge switch 180, an array 174 (first circuit) for which "N" series connections of switches Rx (second switches) and capacitors Fx (first capacitors) are connected in parallel is provided. A variable "N" is an integer equal to or larger than 1. A variable "x" is an integer of 1 to "N". By adjusting the number of switches to be turned ON among the switches Rx, a combined capacity (blanking capacity) of the array 174 can be adjusted. As the switches to be turned ON are increased, the combined capacity (blanking capacity) of the array 174 can be increased. The blanking filter 175 in FIG. 4 includes the array 174 and the discharge switch 180.

The signal (delay adjustment signal) indicating one or more switches to be turned ON is inputted from the control circuit 110 and the array 174 turns ON the switches indicated by the signal. When the control signal (the signal indicating ON of the semiconductor switching element Q) is inputted to the discharge switch 180, the discharge switch 180 is turned OFF and charging of the blanking capacity is started. As a charging amount increases, the voltage of the node N1 becomes high. By adjusting the size of the blanking capacity, a rising rate of the voltage of the node N1 can be adjusted. The time until reaching the threshold voltage of the comparator circuit 130 or a predetermined value at the charging rate from charging start (OFF start of the discharge switch 180) corresponds to the blanking period (first period) as an example. The blanking time requires to be set to the allowable time or smaller of the overcurrent detection described above. In addition, the blanking time requires to be longer than the time for the gate voltage of the semiconductor switching element Q to reach the threshold. The blanking period corresponds to the period during which overcurrent protection is ineffective. When the semiconductor switching element Q is turned ON, the collector-emitter voltage lowers and the voltage according to the collector-emitter voltage is outputted to the node N1 via the detection circuit 155.

The comparator circuit 130 compares the voltage of the node N1 (object voltage) and the threshold voltage (DESAT voltage) and outputs a signal (first signal) according to a comparison result. As an example, a high level signal is outputted when the object voltage is the threshold voltage or higher and a low level signal is outputted when the object voltage is lower than the threshold voltage. However, the relation between the high level signal and the low level signal to be outputted according to the comparison result may be opposite.

The threshold voltage used in the comparator circuit 130 is adjustable according to an adjustment signal (threshold adjustment signal) from the control circuit 110. The threshold adjustment signal from the control circuit 110 is inputted via a signal line L2. The threshold adjustment signal is a digital signal but can be an analog signal. In the case of receiving the threshold adjustment signal from the control circuit 110, the comparator circuit 130 adjusts the threshold voltage based on the threshold adjustment signal.

Figure 5:
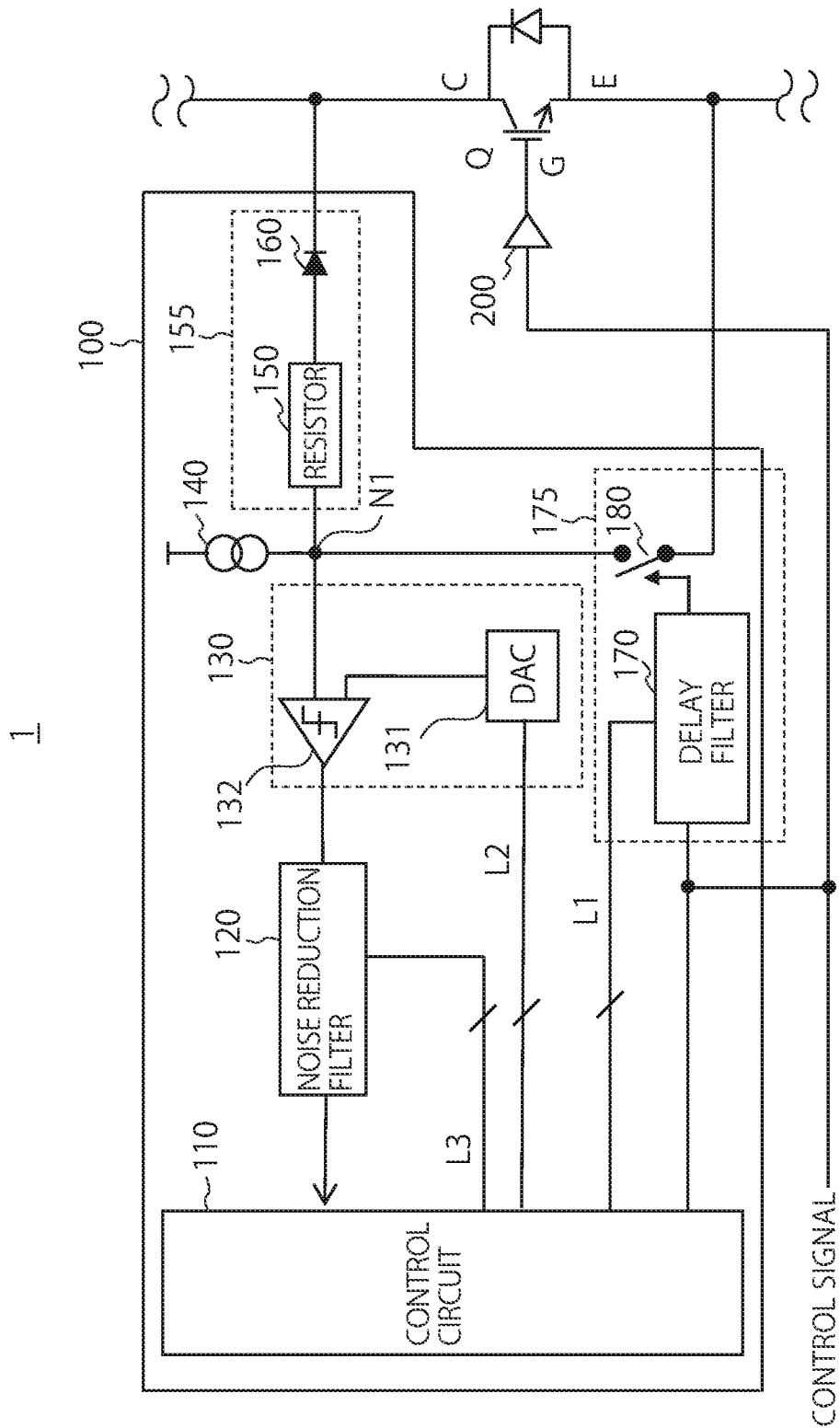
FIG. 5 is a diagram illustrating a specific example of a comparator circuit.

FIG. 5 is a diagram illustrating a specific example of the comparator circuit 130. The configuration other than the comparator circuit 130 is the same as FIG. 1. The comparator circuit 130 includes a DAC 131 and an analog comparator 132. The DAC 131 receives the digital signal (threshold adjustment signal) indicating the threshold voltage from the control circuit 110 and converts the digital signal to the analog signal. The analog comparator 132 compares the voltage of the analog signal corresponding to the threshold and the voltage (voltage detected in the detection circuit 155) of the node N1 and outputs the signal (the high level signal or the low level signal) according to the comparison result.

Figure 6:
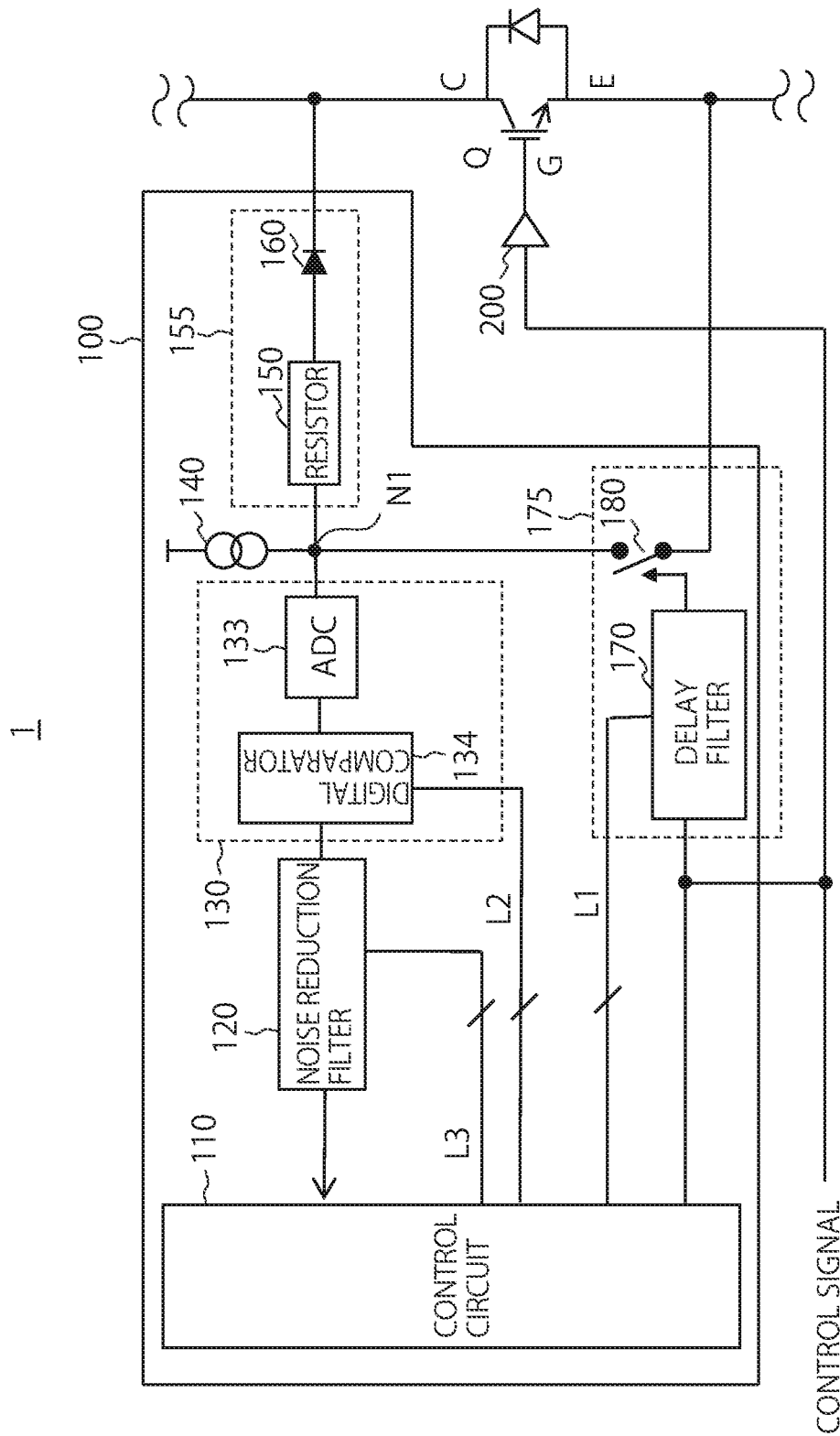
FIG. 6 is a diagram illustrating another specific example of the comparator circuit.

FIG. 6 is a diagram illustrating another specific example of the comparator circuit 130. The comparator circuit 130 includes an ADC 133 and a digital comparator 134. The ADC 133 receives the analog signal indicating the voltage of the node N1 and converts the analog signal to the digital signal. The digital comparator 134 receives the digital signal indicating the threshold voltage from the control circuit 110 and compares the digital signal and the digital signal indicating the voltage of the node N1. The digital comparator 134 outputs the signal (the high level signal or the low level signal) according to the comparison result.

The noise reduction filter 120 is a filter (second filter) which passes a comparison result signal inputted from the comparator circuit 130 to the control circuit 110 and reduces passing of the other signals as noise signals. The noise signals include, for example, the signal inputted from a device or an element other than the present electronic circuitry 1 or the signal inputted from the element within the present circuit 1. By reducing the passing of the noise signals, the erroneous detection of the overcurrent is prevented. In the case where a high level comparison result signal is inputted, the control circuit 110 determines generation of the overcurrent and executes the protective function of performing control of turning OFF the semiconductor switching element Q. For example, the control circuit 110 gently lowers the control signal and gently turns OFF the semiconductor switching element Q. For the control circuit 110, the high level comparison result signal means detection of the overcurrent. The control circuit 110 may determine the generation of the overcurrent in the case where the high level comparison result signal is inputted for a fixed period or longer. Thus, the erroneous detection of the overcurrent due to temporary input of the noise signal which could not be reduced in the noise reduction filter 120 can be prevented. However, at the time of the evaluation test of the present embodiment to be described later, the control circuit 110 may be set so as not to perform the protective operation even when the high level comparison result signal is inputted to the control circuit 110.

A noise reduction range (a time range or a frequency range) in which the noise reduction filter 120 reduces the noise signal is adjustable according to an adjustment signal (reduction range adjustment signal) from the control circuit 110. The reduction range adjustment signal from the control circuit 110 is inputted via a signal line L3. The reduction range adjustment signal is a digital signal but can be an analog signal. In the case of receiving the reduction range adjustment signal from the control circuit 110, the noise reduction filter 120 adjusts the noise reduction range based on the reduction range adjustment signal.

Figure 7:
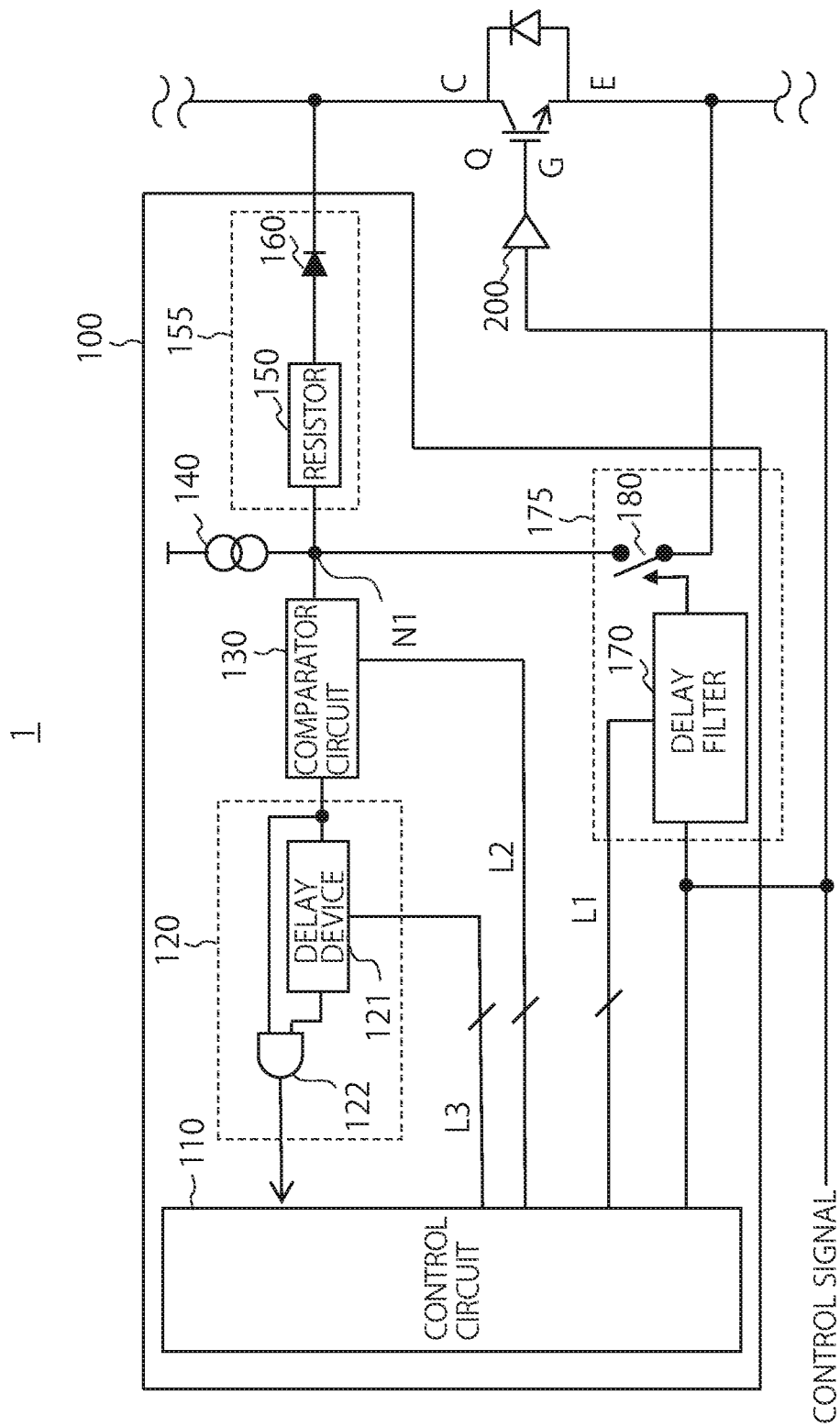
FIG. 7 is a diagram illustrating a specific example of a noise reduction filter.

FIG. 7 is a diagram illustrating a specific example of the noise reduction filter 120. The noise reduction filter 120 includes a digitally controllable delay circuit 121 and an AND circuit (AND logic circuit) 122. The comparison result signal from the comparator circuit 130 is inputted to the delay circuit 121 and the delay circuit 121 delays the comparison result signal by the time (delay time) set beforehand and outputs the delayed signal. The delay time corresponds to a time range of reducing the noise signal as an example. To the AND logic circuit 122, the comparison result signal from the comparator circuit 130 and the comparison result signal delayed in the delay circuit 121 are inputted, and a logical product of both signals is outputted. The AND logic circuit 122 outputs a high level signal when both signals are a high level, and outputs a low level signal when at least either one is a low level. Thus, only in the case where the high level comparison result signal meaning the detection of the overcurrent is inputted for a fixed time or longer, the high level comparison result signal is outputted from the AND logic circuit 122. Even when the noise signal is temporarily added to the low level comparison signal for a short time, the output of the high level comparison result signal from the AND logic circuit 122 is suppressed. The delay time in the delay circuit 121 is adjustable by the reduction range adjustment signal from the control circuit 110. The delay circuit 121 adjusts the delay time (noise reduction time range) based on the reduction range adjustment signal from the control circuit 110.

Figure 8:
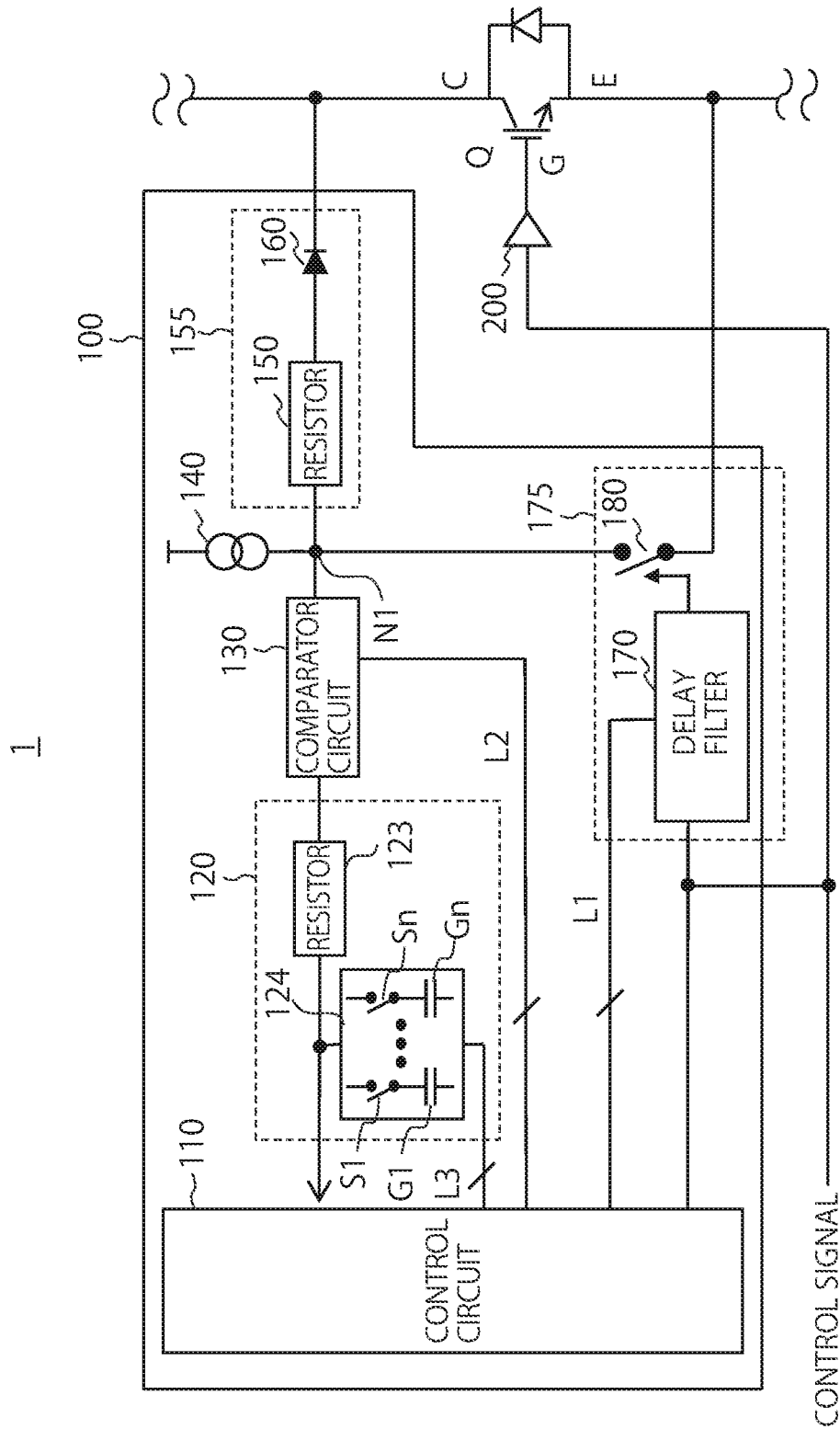
FIG. 8 is a diagram illustrating another specific example of the noise reduction filter.

FIG. 8 is a diagram illustrating another specific example of the noise reduction filter 120. The noise reduction filter 120 in FIG. 8 is a low-pass filter which reduces the noise signals in a frequency range of a high frequency. The noise reduction filter 120 includes a resistor 123. In addition, the noise reduction filter 120 includes an array 124 (second circuit) provided with a set of "M" (an integer equal to or larger than 2) switches Sx (third switches) and "M" capacitors Gx connected to the "M" switches Sx. A variable "x" is an integer of 2 to "M". The sets of the switch Sx and the capacitor Gx in the array 124 are connected in parallel between the control circuit 110 and the resistor 123. One end of the capacitor Gx is connected to the reference voltage and the other end is connected to one end of the switch Sx. The other end of the switch Sx is connected to an output side terminal of the resistor 123. An input side terminal of the resistor 123 is connected to the output terminal of the comparator circuit 130.

The frequency range to be reduced in the noise reduction filter 120 can be adjusted by the combined capacity of the array 124 on the output side of the resistor 123. By adjusting the number of the switches Sx to be turned ON, the combined capacity can be adjusted. The reduction range adjustment signal specifying the switches Sx to be turned ON is outputted from the control circuit 110 and the noise reduction filter 120 turns ON the switches Sx specified by the reduction range adjustment signal. The other switches Sx are turned OFF. Thus, the frequency range for reducing the noise signal is adjusted.

For a main frequency component of the noise signal from outside, a high frequency component is assumed. Though the comparison result signal includes the high frequency component in a rising or falling part, it is basically a high level or low level fixed voltage and a low frequency component is dominant. Thus, by reducing (suppressing) the high frequency component, it is possible to pass the comparison result signal while reducing the noise signals. The combined capacity may be adjusted according to the range of the assumed frequency component of the noise signals.

The control circuit 110 includes a microprocessor or a processor or the like which executes software (program) that controls the present electronic circuitry 1. However, the control circuit 110 may be configured by an exclusive circuit such as a digital circuit or an analog circuit. Both of the exclusive circuit and the processor or the like may be included. The control circuit 110 can control the blanking filter 175, the comparator circuit 130 and the noise reduction filter 120 via the signal lines L1-L3 connected with them respectively. The control circuit 110 controls the blanking filter 175, the comparator circuit 130 and the noise reduction filter 120 and performs the operation of the evaluation test relating to the present embodiment. Thus, the blanking time of the blanking filter 175, the threshold voltage of the comparator circuit 130 and the noise reduction range of the noise reduction filter 120 are determined and the blanking time, the threshold voltage and the noise reduction range are adjusted. In more detail, it is as follows.

The control circuit 110 determines the blanking time (for example, the delay time in the example in FIG. 3 or the number of the switches to be turned ON in the example in FIG. 4) to be used in the blanking filter 175 by the evaluation test. The control circuit 110 sends the delay adjustment signal including information regarding the determined blanking time to the blanking filter 175 via the signal line L1. The blanking filter 175 adjusts the blanking time based on the delay adjustment signal. Specifically, the delay time of the delay circuit 171 in the example in FIG. 3 is adjusted or the number of the switches Rx to be turned ON in the example in FIG. 4 is adjusted.

The control circuit 110 determines the threshold voltage to be used in the comparator circuit 130 by the evaluation test. The control circuit 110 sends the threshold adjustment signal indicating the determined threshold to the comparator circuit 130. The comparator circuit 130 adjusts the threshold voltage based on the threshold adjustment signal.

The control circuit 110 determines the noise reduction range (the noise reduction frequency range or the noise reduction time range) to be used in the noise reduction filter 120 by the evaluation test. The control circuit 110 sends the reduction range adjustment signal indicating the determined noise reduction range to the noise reduction filter 120 via the signal line L3. The noise reduction filter 120 adjusts the noise reduction range based on the reduction range adjustment signal. Specifically, the combined capacity in the example in FIG. 8 is adjusted (the frequency range is adjusted) or the delay time in the example in FIG. 7 is adjusted (the noise reduction time range is adjusted).

In the configuration illustrated in FIG. 1-FIG. 8, the control circuit 110 is electrically connected to the blanking filter 175, the comparator circuit 130 and the noise reduction filter 120 via the signal lines L1-L3, however, an electrically separated configuration is also possible.

Figure 9:
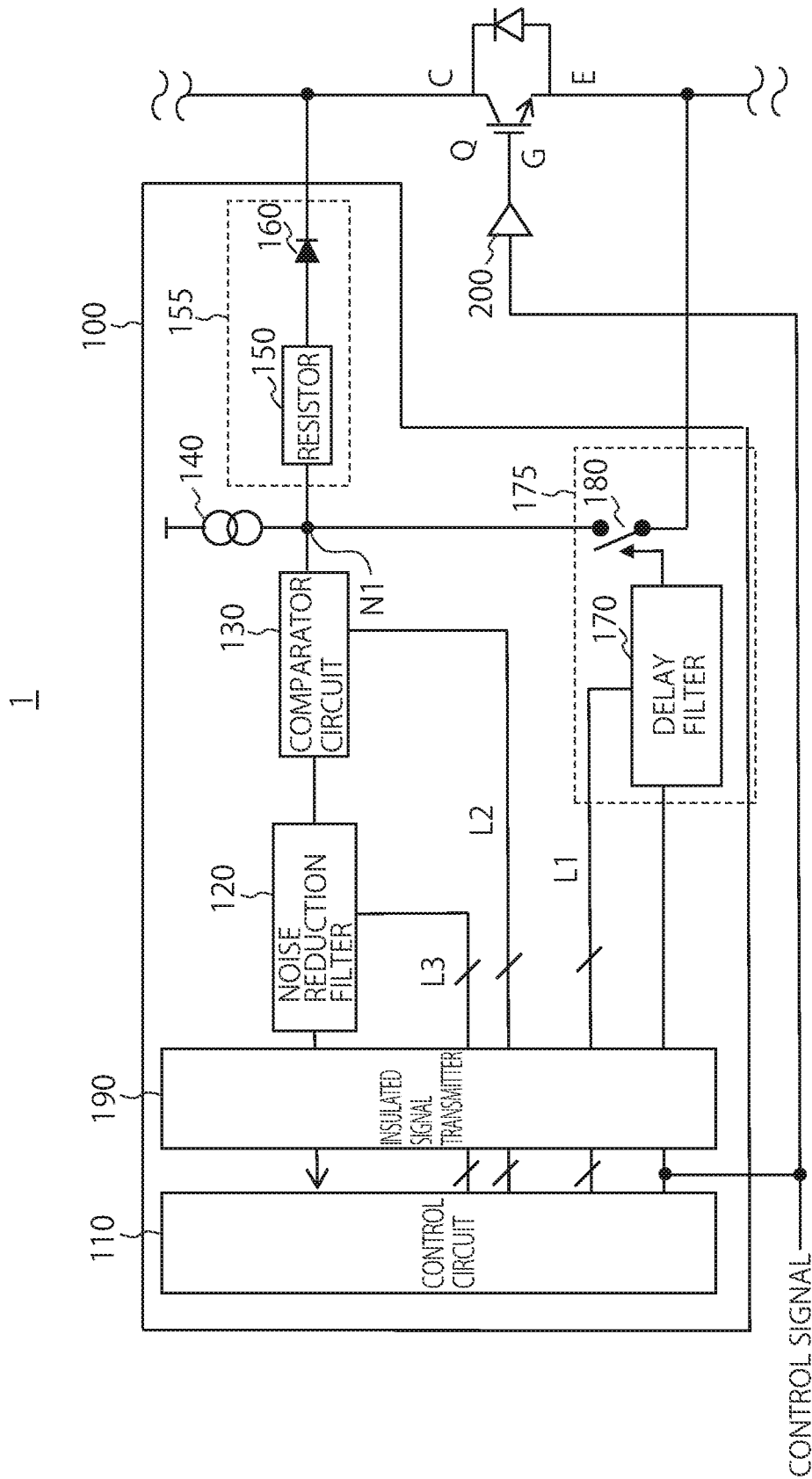
FIG. 9 is a diagram illustrating an example of providing an insulated signal transmitter between a control circuit and the blanking filter, the comparator circuit and the noise reduction filter.

FIG. 9 illustrates an example of providing an insulated signal transmitter 190 between the control circuit 110 and the blanking filter 175, the comparator circuit 130 and the noise reduction filter 120. The insulated signal transmitter 190 transmits and receives the signal to/from the control circuit 110 via magnetic coupling, optical coupling or capacitive coupling or the like. Thus, even in the case where the reference voltage (grounding voltage or the like) on the side of the control circuit 110 and the reference voltage on the side of the external circuit (the blanking filter 175, the comparator circuit 130 and the noise reduction filter 120 or the like) are different, the operation between the control circuit 110 and the external circuit is made possible. As an example of the insulated signal transmitter 190, at least one of a transformer, a photocoupler and a capacitor can be used.

Hereinafter, the evaluation test performed by the control circuit 110 will be described in detail.

The control circuit 110 performs the evaluation test by outputting the control signal of the semiconductor switching element Q once or more for a fixed period and monitoring the output signal of the noise reduction filter 120. In the case where the semiconductor switching element Q is not short-circuited with another device (a load device or another semiconductor switching element or the like), the overcurrent is not generated and the output signal to the control signal ought to be basically the low level, that is lower than the voltage determined as the high level. In the case where the output signal to the control signal is the low level, the control circuit 110 determines that respective settings of the noise reduction filter 120, the blanking filter 175 and the comparator circuit 130 are all appropriate.

In the case where the high level signal (hereinafter, a pulse) is included in the output signal, it is conceivable that the setting of at least one of the noise reduction filter 120, the blanking filter 175 and the comparator circuit 130 is inappropriate. In the case where the pulse is included in the output signal, the control circuit 110 detects an object to adjust the setting based on a position and a length or the like of the pulse in the output signal. The control circuit 110 adjusts the setting of the detected object. The object to adjust the setting is at least one of the noise reduction filter 120, the blanking filter 175 and the comparator circuit 130. Hereinafter, by using specific examples, the example that the control circuit 110 detects the object to adjust the setting, and the example of adjusting the setting of the detected object will be described. It is assumed that the semiconductor switching element Q is not short-circuited (the overcurrent is not generated).

Figure 10:
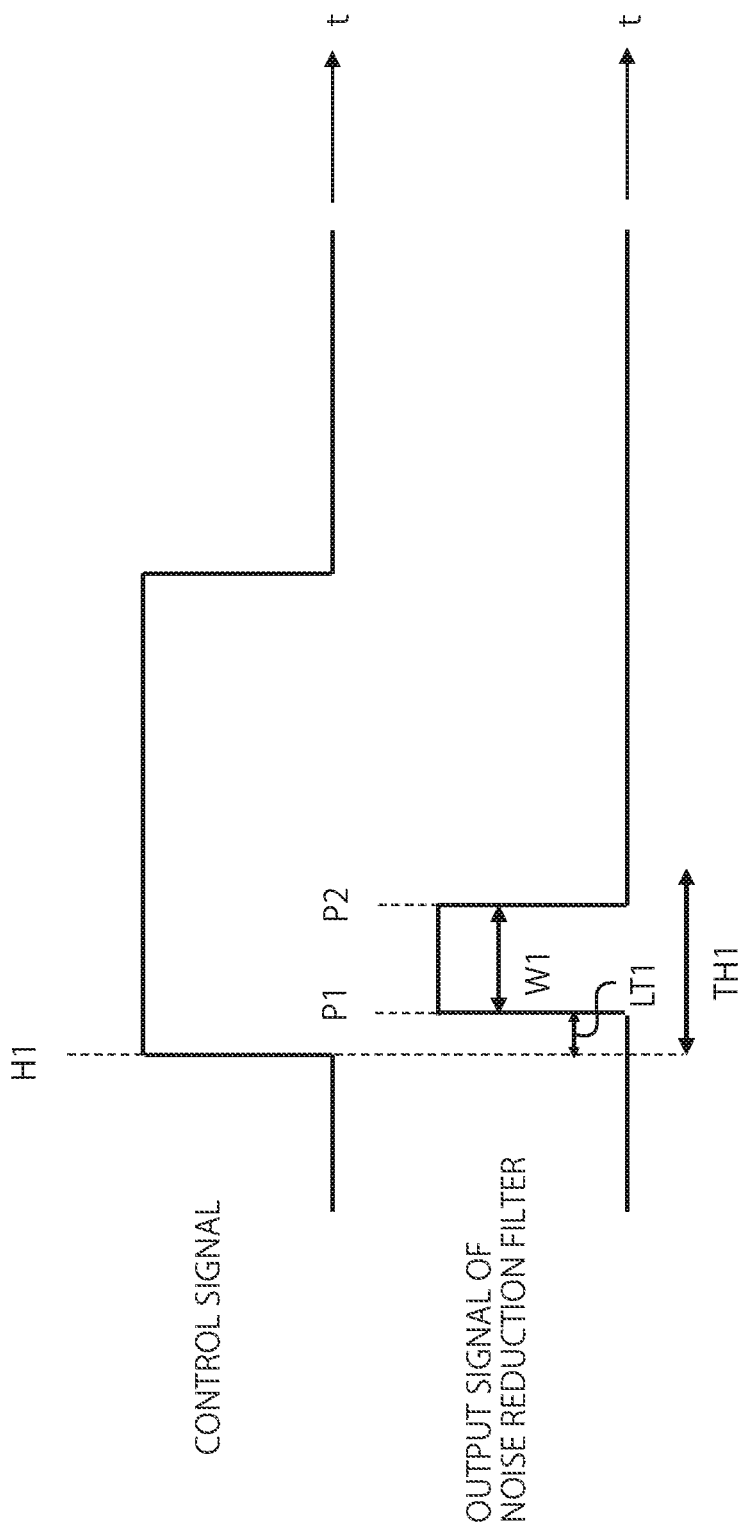
FIG. 10 is a diagram illustrating a first example of a waveform of the control signal inputted to the semiconductor switching element and a waveform of an output signal of the noise reduction filter.

FIG. 10 illustrates a first example of a waveform of the control signal inputted to the semiconductor switching element Q and a waveform of the output signal of the noise reduction filter 120. A horizontal axis is time (t) and a vertical axis is amplitude. The pulse (high level signal) is generated in the output signal of the noise reduction filter 120.

The position of a first rising edge P1 of the pulse of the output signal is settled within a fixed time (threshold time) TH1 from the position of a first rising edge H1 of a control signal pulse. That is, a time length LT1 from the position of the edge H1 to the edge P1 is TH1 or shorter. In the case of detecting that the position of the edge P1 is settled within the fixed time TH1 from the position of the edge H1, the control circuit 110 determines to increase the blanking time in the blanking filter 175. The control circuit 110 performs setting so as to increase the blanking time (so as to increase the delay time of the delay circuit 171 in the example in FIG. 3 or increase the combined capacity of the array 174 in the example in FIG. 4). As the blanking time is increased, the position of the edge P1 is moved in a time direction (a pulse width is narrowed) according to the increase of the blanking time. By the increase of the blanking time, when the edge P1 is moved to the position of a falling edge P2, the pulse of the output signal disappears.

As the example of adjusting the blanking time, the delay time of the delay circuit 171 is sometimes increased by unit time or the combined capacity of the array 174 is sometimes increased by a unit amount (the switches Rx to be turned ON are increased by a unit number in the example in FIG. 4) for example. The control circuit 110 may detect a pulse width W1 of the output signal and increase the blanking time (the delay time or the combined capacity or the like) more as the pulse width W1 is larger. Information such as a table in which the pulse width W1 and an increase amount of the blanking time are made to correspond may be preset in a storage accessible from the control circuit 110 and the increase amount of the blanking time according to the pulse width W1 may be determined based on the information. Thus, the number of times of repeating the evaluation test can be reduced and the setting of the blanking time can be completed in a short time. The storage may be a memory or may be a register.

Note that, while the waveform illustrated in FIG. 10 is a signal waveform of positive logic, processing is similarly possible for a negative logic waveform.

Figure 11:
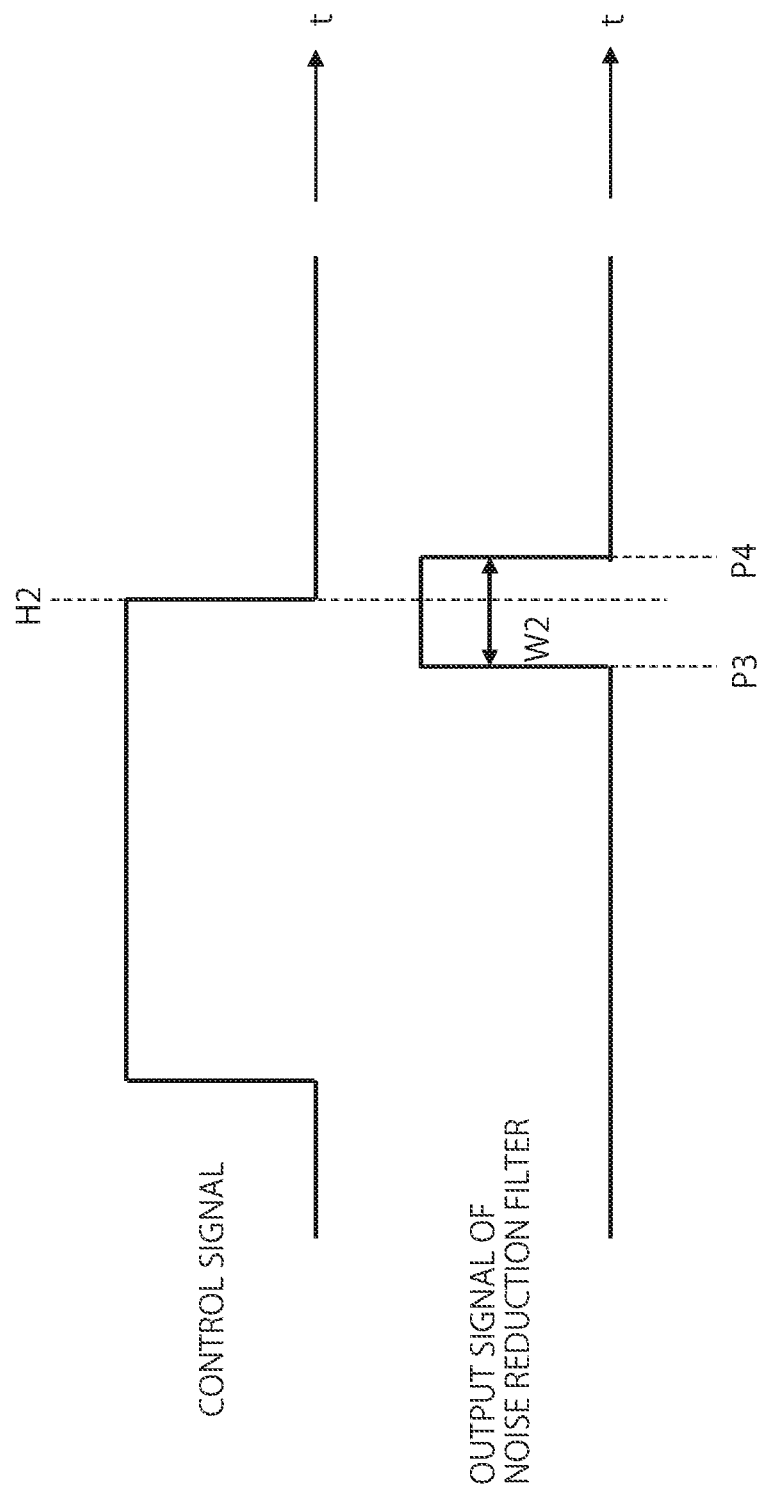
FIG. 11 is a diagram illustrating a second example of the waveform of the control signal inputted to the semiconductor switching element and the waveform of an output signal of the noise reduction filter.

FIG. 11 illustrates a second example of the waveform of the control signal inputted to the semiconductor switching element Q and the waveform of the output signal of the noise reduction filter 120. The horizontal axis is the time (t) and the vertical axis is the amplitude. The pulse (high level signal) is generated in the output signal of the noise reduction filter 120. The position of a rear edge (falling edge) P4 of the output signal is at the rear of the position of a rear edge H2 of the control signal pulse. In the case of detecting that the position of the edge P4 is at the rear of the edge H2, the control circuit 110 determines to increase the threshold voltage in the comparator circuit 130. The control circuit 110 sets the threshold voltage in the comparator circuit 130 to be large. As the threshold voltage is increased, a rising edge P3 of the output signal is moved in the time direction (the pulse width is narrowed). When the rising edge is moved to the position of the falling edge P4, the pulse of the output signal disappears.

As the example of adjusting the threshold voltage in the comparator circuit 130, the threshold voltage is sometimes increased by the unit amount for example. Or, the control circuit 110 detects a pulse width W2 of the output signal, determines a change amount (increase amount) of the threshold voltage according to the pulse width W2 and increases the threshold voltage by the determined change amount. For example, as the pulse width W2 is larger, the increase amount of the threshold voltage is increased more. Information such as a table in which the pulse width and the increase amount of the threshold voltage are made to correspond may be preset in a storage accessible from the control circuit 110 and the increase amount of the threshold voltage according to the pulse width W2 may be determined based on the information. Thus, the number of times of repeating the evaluation test can be reduced and the setting of the threshold voltage can be completed in a short time. The storage may be a memory or may be a register.

Note that, while the waveform illustrated in FIG. 11 is the signal waveform of the positive logic, the processing is similarly possible for the negative logic waveform.

Figure 12:
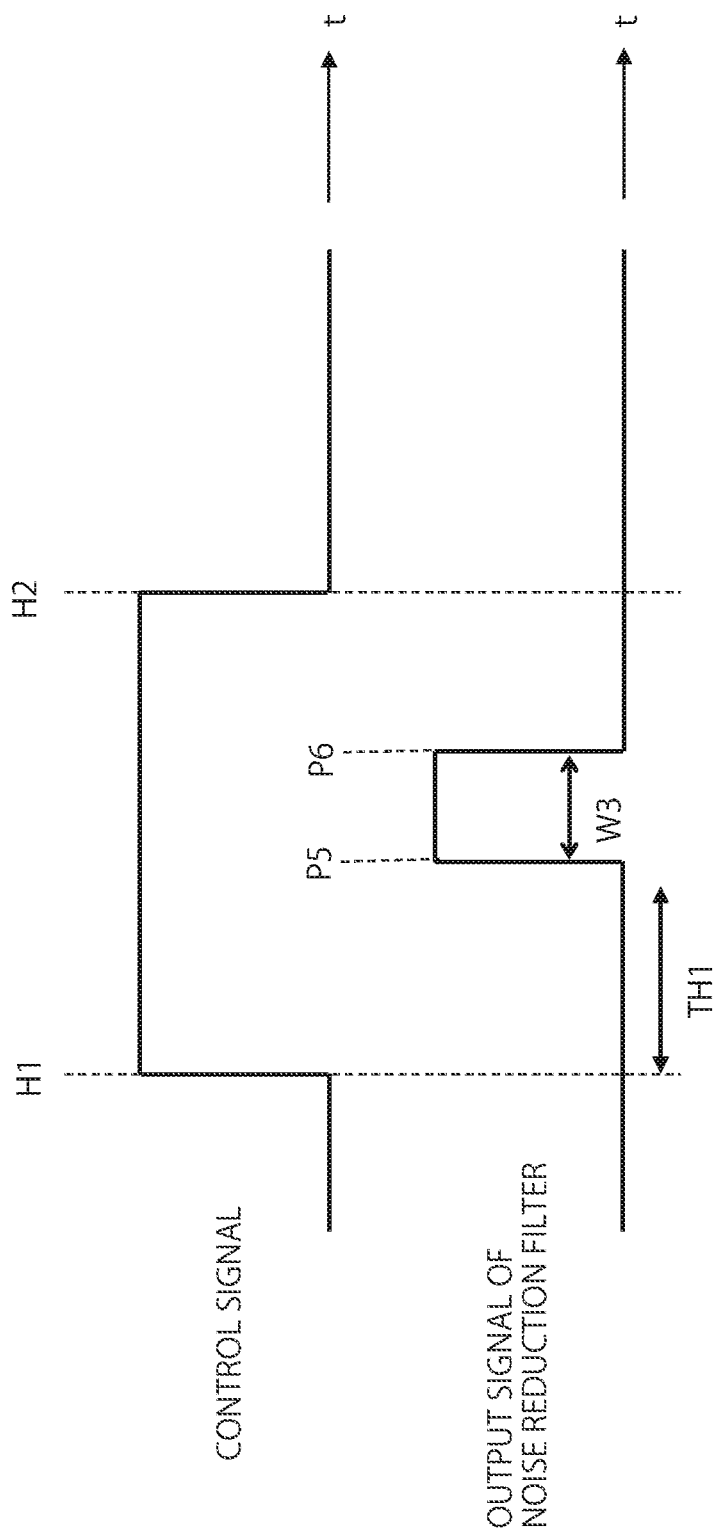
FIG. 12 is a diagram illustrating a third example of the waveform of the control signal inputted to the semiconductor switching element and the waveform of an output signal of the noise reduction filter.

FIG. 12 illustrates a third example of the waveform of the control signal inputted to the semiconductor switching element Q and the waveform of the output signal of the noise reduction filter 120. The horizontal axis is the time (t) and the vertical axis is the amplitude. The pulse (high level signal) is generated in the output signal of the noise reduction filter 120.

A first edge P5 of the output signal of the noise reduction filter 120 is not settled within the fixed time (threshold time) TH1 from the first edge H1 of the pulse of the control signal. In addition, a rear edge P6 of the pulse of the output signal of the noise reduction filter 120 is in front of the rear edge H2 of the pulse of the control signal. In this case, since the settings of both of the blanking time and the threshold voltage are appropriate, there is a problem in the setting of the noise reduction range of the noise reduction filter. In the case of detecting that the edge P5 is not settled within the threshold time TH1 from the edge H1 and the edge P6 is in front of the edge H2, the control circuit 110 determines to increase the noise reduction range. The control circuit 110 sets the noise reduction range in the noise reduction filter 120 to be large.

As the example of adjusting the noise reduction range in the noise reduction filter 120, in the example in FIG. 7, the delay time in the delay circuit 121 is sometimes increased by the unit time. The unit time is set beforehand. Or, the control circuit 110 detects a pulse width W3 of the output signal, determines a change amount (increase amount) of the delay time according to the pulse width W3 and increases the delay time by the determined change amount. For example, as the pulse width W3 is larger, the increase amount of the delay time is increased more. Information such as a table in which the pulse width and the increase amount of the delay time are made to correspond may be preset in a storage accessible from the control circuit 110 and the increase amount of the delay time according to the pulse width W3 may be determined based on the information. Thus, the number of times of repeating the evaluation test can be reduced and the setting of a pulse reduction width can be completed in a short time. The storage may be a memory or may be a register.

Note that, while the waveform illustrated in FIG. 12 is the signal waveform of the positive logic, the processing is similarly possible for the negative logic waveform.

Figure 13:
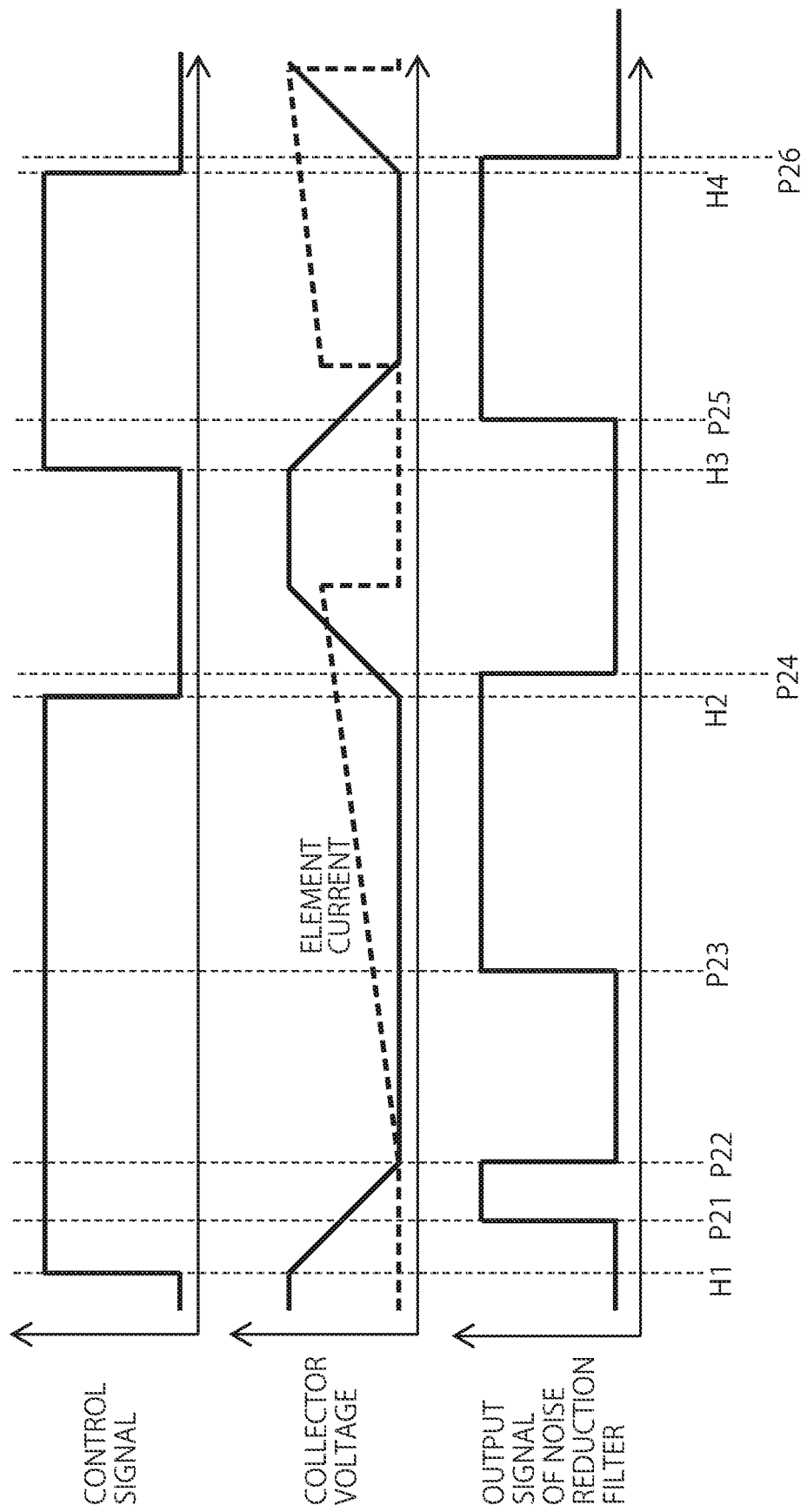
FIG. 13 is a diagram illustrating an example of performing a double pulse test of inputting a turn-on control signal (pulse) to the semiconductor switching element twice.

FIG. 13 illustrates an example of performing a double pulse test of inputting an ON control signal (pulse) to the semiconductor switching element Q twice. A first pulse in the control signal is longer than a second pulse. FIG. 13 illustrates the waveform of the control signal inputted to the semiconductor switching element Q, the waveform of the collector voltage and the waveform of the collector current of the semiconductor switching element Q and the waveform of the output signal of the noise reduction filter 120. The horizontal axis is the time (t) and the vertical axis is the amplitude. The pulse (high level signal) is generated three times in the output signal of the noise reduction filter 120. In the example in FIG. 13, the device other than the semiconductor switching element Q is not operated and it is assumed that there is no input of the noise signal.

The first pulse (edge P21-edge P22) in the output signal of the noise reduction filter 120 corresponds to the case described in FIG. and the blanking time requires to be adjusted. The second pulse (edge P23-edge P24) corresponds to the case described in FIG. 11 and the threshold voltage requires to be adjusted. For a third pulse (edge P25-edge P26), the pulse in the case described in FIG. 10 and the pulse in the case described in FIG. 11 are connected and turned to one pulse. The reason will be described as follows.

When the first pulse (H1-H2) of the control signal ends, the collector voltage gradually rises. Though the collector current gently rises at a gradient determined by the parasitic inductor of the semiconductor switching element Q, when the semiconductor switching element Q is turned OFF, the collector current stops. The current is stored in a parasitic inductance of the semiconductor switching element, and when the second pulse (edge H3-edge H4) of the control signal is inputted, the collector voltage is lowered by the turn-on of the semiconductor switching element Q and the current starts to rise from the stored state. Therefore, the voltage of the node N1 increases more quickly than the time when the first pulse of the control signal is inputted. Thus, the pulse is turned to a shape of being extended to a left side such that the rising edge of the pulse in the case described in FIG. 11 is moved to the left side and connected with the pulse in the case described in FIG. 10.

The control circuit 110 sets the blanking filter 175 and the comparator circuit 130 as described in FIG. 10 and FIG. 11 also in the case of the double pulse test. The double pulse test may be repeatedly performed until the pulse of the output signal of the noise reduction filter 120 is not generated anymore.

The control circuit 110 may adjust the setting of the blanking filter 175 or the comparator circuit 130 based on the number of the pulses included in the output signal of the noise reduction filter 120, in the double pulse test. When the number of the pulses is 3 or larger, the control circuit 110 determines that the setting of at least one of the blanking filter 175 and the comparator circuit 130 is inappropriate and adjusts the setting of at least one of the blanking filter 175 and the comparator circuit 130. For example, the comparator circuit 130 is set before the blanking filter 175, and when the setting of the comparator circuit 130 is completed, the blanking filter 175 may be set when the number of the pulses becomes 2 or smaller for example.

In the case where a processing resolution of the control circuit 110 is low, it may be determined that the time of the falling edge P24 at an end of the second pulse of the output signal of the noise reduction filter 120 coincides with the time of the falling edge H2 of the pulse of the control signal. In this case, even though the edge P24 is later than the time of the edge H2, it is determined that the edge P24 is not later than the edge H2 and it is erroneously determined that the threshold voltage of the comparator circuit 130 is appropriate. Therefore, by performing the processing paying attention to the number of the pulses, even in such a case where the resolution is low, it becomes possible to detect inappropriateness of the threshold voltage of the comparator circuit 130 and adjust the threshold voltage.

In the double pulse test described above, it is assumed that the other device is not operated and the noise signal is not mixed in. However, even in this case, the noise signal may be mixed in the output signal by resonance in the present device. The noise signal by the resonance is a thin pulse-like signal and the frequency component is high. In order to prevent the noise signal from being counted in the number of the pulses, a resonance frequency may be identified beforehand and the noise reduction filter 120 may be set to reduce the frequency around and higher than the resonance frequency.

In the double pulse test described above, after the setting of the comparator circuit 130 and the blanking filter 175 is completed, the noise reduction filter 120 may be set by performing the evaluation test such as the double pulse test again in the state of operating the other device or the like connected to the semiconductor switching element Q. Examples of the other device are the load device and another semiconductor switching element connected to the collector or the emitter of the semiconductor switching element Q.

Note that, while the waveform illustrated in FIG. 13 is the signal waveform of the positive logic, the processing is similarly possible for the negative logic waveform.

Figure 14:
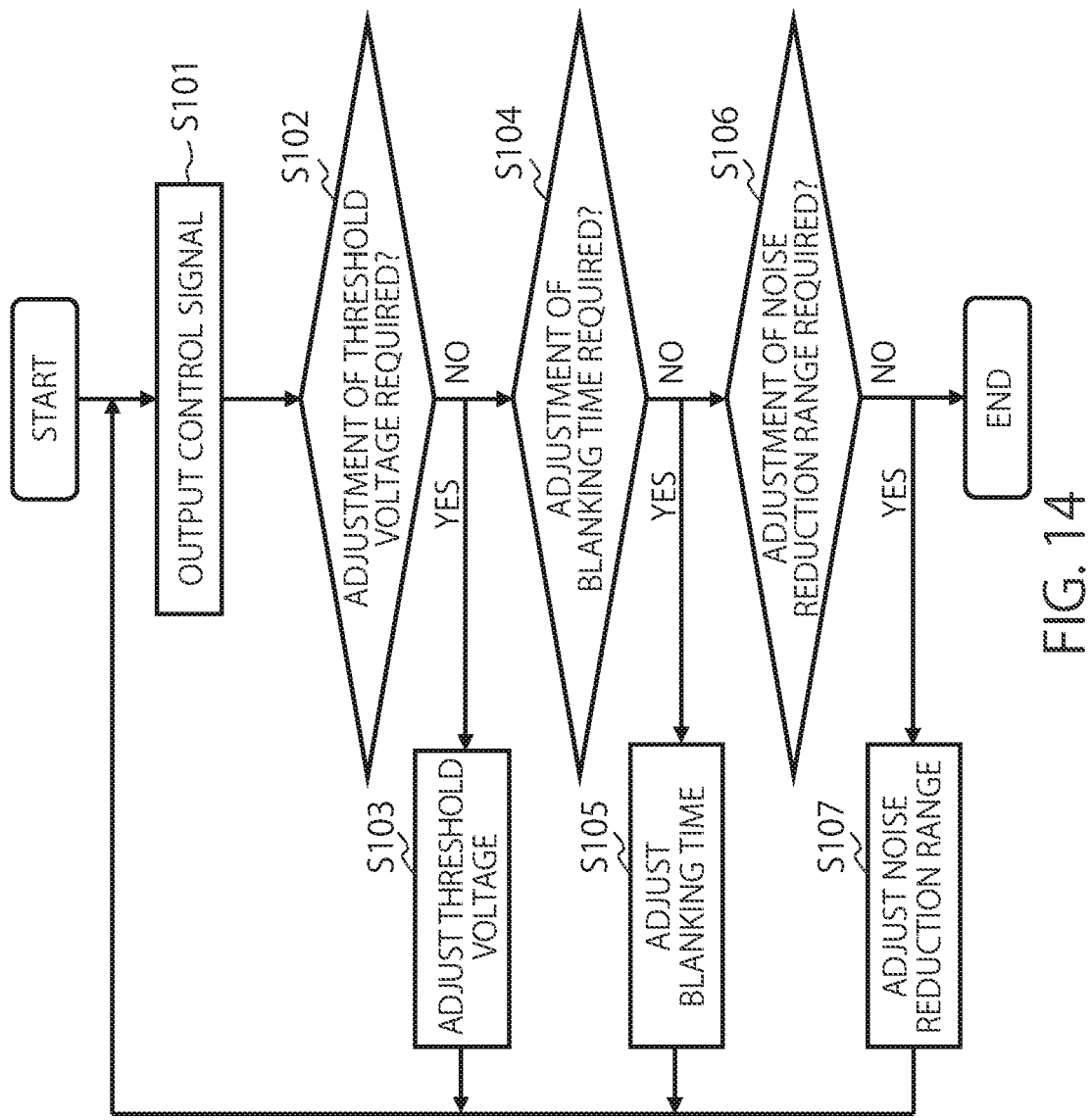
FIG. 14 is a flowchart illustrating an example of an operation of the control circuit.

FIG. 14 is a flowchart illustrating an example of the operation of the control circuit 110. The operation illustrated in FIG. 14 is achieved by making the processor in the control circuit 110 execute a computer program as an example. The computer program is stored in a storage such as a memory accessible from the control circuit 110. At the start of the operation of the present flowchart, the control circuit 110 may reset at least one of the threshold voltage used in the comparator circuit 130, the blanking time used in the blanking filter 175 and the noise reduction range used in the noise reduction filter 120. Resetting is to set the threshold voltage, the blanking time and the noise reduction range to initial values respectively for example. The initial value of the threshold voltage may be a minimum value of the settable threshold voltage or may be some other value. The initial value of the blanking time may be the minimum value of the settable blanking time or may be some other value. The initial value of the noise reduction range may be a minimum range of the settable noise reduction range or may be some other range. The control circuit 110 may perform the resetting in the case where the threshold voltage exceeds the predetermined reference voltage and may omit the resetting of the threshold voltage in the case where the threshold voltage does not exceed the predetermined reference voltage. The control circuit 110 may reset the blanking time in the case where the blanking time exceeds predetermined reference time and may omit the resetting of the blanking time in the case where the blanking time does not exceed the predetermined reference time. The control circuit 110 may reset the noise reduction range in the case where the noise reduction range exceeds a predetermined reference range and may omit the resetting of the noise reduction range in the case where the noise reduction range does not exceed the predetermined reference range.

The control circuit 110 generates the control signal which turns ON the semiconductor switching element Q and outputs the generated control signal (S101). While the control circuit 110 generates the control signal in the present operation example, the external circuit other than the control circuit 110 may generate the control signal. In this case, the control circuit 110 outputs an instruction signal which instructs generation and output of the control signal to the external circuit. In such a manner, the control circuit 110 performs control of generating the control signal and outputting the control signal to the semiconductor switching element Q.

The control circuit 110 receives the output signal of the noise reduction filter 120 and determines whether or not the threshold voltage in the comparator circuit 130 requires to be adjusted based on the received output signal (S102). For a method of determination, the method described in FIG. 11 above is used for example. In the case of determining that the threshold voltage requires to be adjusted, the control circuit 110 determines to increase the threshold voltage by the unit amount, increases the threshold voltage by the unit amount and returns to step S101. The increase of the threshold voltage by the unit amount is an example, and the threshold voltage may be increased according to the pulse width which is a basis of the determination that the threshold voltage is to be adjusted in the output signal (see description of FIG. 11).

In the case of determining that the threshold voltage does not require to be adjusted, the control circuit 110 determines whether or not adjustment of the blanking time is required based on the output signal of the noise reduction filter 120 (S104). For the method of the determination, the method described in FIG. 10 above is used for example. In the case of determining that the blanking time requires to be adjusted, the control circuit 110 determines to increase the blanking time by the unit time, increases the blanking time by the unit time (S105) and returns to step S101. The increase of the blanking time by the unit time is an example, and the blanking time may be increased according to the pulse width which is the basis of the determination that the blanking time is to be adjusted in the output signal (see description of FIG. 10).

In the case of determining that neither of the threshold voltage and the blanking time requires to be adjusted, the control circuit 110 determines whether or not the adjustment of the noise reduction range is required based on the output signal of the noise reduction filter 120 (S106). For the method of the determination, the method described in FIG. 12 above is used for example. In the case of determining that the noise reduction range requires to be adjusted, the control circuit 110 determines to increase the noise reduction range by a unit range (the unit time in the case of the delay circuit or the frequency range according to the increase of a unit combined capacity in the case of the low-pass filter for example), increases the noise reduction range (S107) and returns to step S101. The noise reduction range may be increased according to the pulse width which is the basis of the determination that the noise reduction range is to be adjusted in the output signal (see description of FIG. 12).

In the case of determining that none of the threshold voltage, the blanking time and the noise reduction range requires to be adjusted, the control circuit 110 ends the present operation.

The operation illustrated in FIG. 14 is an example and is variously deformable. For example, in the case where the control signal is outputted in step S101 after step S105, step S102 may be skipped and the operation may advance to step S104. The operation is effective in the case where there is no requirement to consider the case of readjusting the threshold voltage after the adjustment of the threshold voltage is completed.

In addition, while the operation returns to step S101 after step S103 in a flow in FIG. 14, the operation may advance to step S104 without returning to step S101. That is, the determination in both of steps S102 and S104 may be performed by one-time output of the control signal. Further, similarly, the determination in three steps S102, S104 and S106 may be performed by one-time output of the control signal.

In addition, in the case where the control signal is outputted in step S101 after step S107, steps S102 and S104 may be skipped and the operation may advance to step S106. The operation is effective in the case where there is no requirement to consider the case of readjusting the threshold voltage and the blanking time after the adjustment of the threshold voltage and the blanking time is completed.

Further, while the case of outputting a single pulse control signal is assumed in the flow in FIG. 14, a double pulse control signal described in FIG. 13 may be outputted. In the case of outputting the control signal in step S101 of a second time and thereafter, the control signal may be outputted after standing by for a fixed time. Thus, the evaluation test can be performed after discharging the current stored in the parasitic inductor of the semiconductor switching element Q.

As described above, according to the present embodiment, at least one of the blanking time of the blanking filter 175, the threshold voltage in the comparator circuit 130 and the noise reduction range of the noise reduction filter can be automatically adjusted by software control from the control circuit 110. Thus, a worker does not require to change elements every time of performing the evaluation test and the evaluation test of the protective function to the semiconductor switching element Q can be easily performed.

Figure 15:
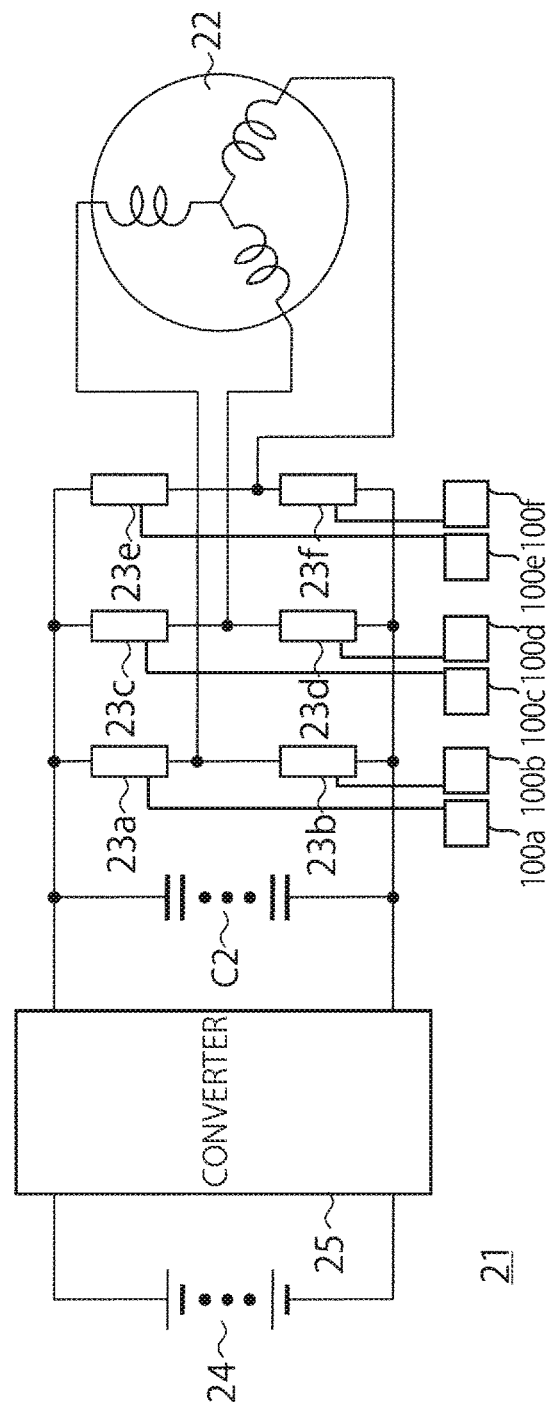
FIG. 15 is a block diagram of a power converter as an electronic system using the electronic circuitry relating to the present embodiment.

FIG. 15 is a block diagram of a power converter as an electronic system using the electronic circuitry relating to the present embodiment. A power converter 21 in FIG. 15 is a three-phase inverter which generates an AC voltage for driving a three-phase motor 22. The power converter 21 includes a plurality of arms 23*a*-23*f*, a DC power source 24, a converter 25, a smoothing capacitor C2 and protective circuits 100*a*-100*f*.

Each of the plurality of arms 23*a*-23*f* includes a semiconductor switching element (IGBT) illustrated in the embodiment described above. The arms 23*a*-23*f* perform an ON or OFF operation respectively at a predetermined timing.

The converter 25 is a DC-DC converter, and converts a DC voltage from the DC power source 24 to a DC voltage of a different voltage level. The smoothing capacitor C2 smooths the voltage outputted from the converter 25.

Two arms in a pair among the arms 23*a*-23*f* are simultaneously turned ON and the current is made to flow to a corresponding coil in the three-phase motor 22. By successively switching the two arms to be simultaneously turned ON, the motor can be driven in three phases. That is, by successively switching the pair of the semiconductor switching elements to be simultaneously turned ON, a three-phase alternating current can be generated from the DC voltage of the DC power source 24. An ON start timing does not require to always coincide to simultaneously turn ON the two arms as long as the two arms are simultaneously ON in at least some period.

The protective circuits 100*a*-100*f* perform the evaluation test and the protective operation of the semiconductor switching elements in the plurality of arms 23*a*-23*f*. The protective circuits 100*a*-100*f* correspond to the protective circuit 100 illustrated in one of FIG. 1 and FIG. 3-FIG. 9. While the protective circuit is provided for each arm in FIG. 15, one protective circuit may be provided for the plurality of arms. For example, one protective circuit may be provided for the arms 23*a*-23*f*, one protective circuit may be provided for two arms or one protective circuit may be provided for three arms.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. Electronic circuitry comprising:
   a detection circuit including a diode, a cathode side of the diode being connected to one end of a semiconductor switching element and an anode side of the diode being connected to a first node;
   a comparator circuit configured to compare a voltage of the first node and a threshold voltage and generate a first signal;
   a first filter connected between the first node and another end of the semiconductor switching element and configured to suppress the voltage of the first node in a first period based on a control signal indicating turn-on of the semiconductor switching element; and
   a control circuit configured to determine at least one of the threshold voltage and the first period based on the first signal.

2. The electronic circuitry according to claim 1, further comprising
   a current source connected to the first node,
   wherein the first filter includes
   a delay circuit configured to receive the control signal and delay the control signal and
   a first switch connected between the first node and the other end of the semiconductor switching element and configured to be turned off based on the delayed control signal, and
   the control circuit determines delay time of the delay circuit.

3. The electronic circuitry according to claim 1, further comprising
   a current source connected to the first node,
   wherein the first filter includes
   a first switch connected between the first node and the other end of the semiconductor switching element and configured to receive the control signal and be turned off and
   a first circuit which is connected between the first node and the other end of the semiconductor switching element and for which a plurality of sets of second switches and first capacitors connected in series are connected in parallel, and
   the control circuit determines the number of the second switches to be turned on in the first circuit.

4. The electronic circuitry according to claim 1,
   wherein the comparator circuit includes
   a DA converter configured to receive a first digital signal indicating the threshold voltage from the control circuit and convert the first digital signal to an analog signal and
   an analog comparator configured to compare the analog signal and the first signal, and
   the control circuit determines the threshold voltage indicated by the first digital signal.

5. The electronic circuitry according to claim 1,
   wherein the comparator circuit includes
   an AD converter configured to convert the first signal to a second digital signal and
   a digital comparator configured to receive a first digital signal indicating the threshold voltage from the control circuit and compare the first digital signal and the second digital signal, and
   the control circuit determines the threshold voltage indicated by the first digital signal.

6. The electronic circuitry according to claim 1,
wherein the control circuit determines either one of the threshold voltage and the first period, based on a relation between a start time of the control signal and a start time of a pulse included in the first signal and a relation between an end time of the control signal and an end time of the pulse included in the first signal.

7. The electronic circuitry according to claim 6,
wherein the control circuit determines the first period when a difference between the start time of the pulse and the start time of the control signal is a threshold time or shorter.

8. The electronic circuitry according to claim 7,
wherein the control circuit counts the number of the pulses and determines at least one of the first period and the threshold voltage based on the number.

9. The electronic circuitry according to claim 8,
wherein the control circuit determines the threshold voltage before determining the first period when the number is 3 or larger.

10. The electronic circuitry according to claim 6,
wherein the control circuit determines the threshold voltage when the end time of the pulse is later than the end time of the control signal.

11. The electronic circuitry according to claim 1, comprising
a second filter configured to reduce a noise signal from the first signal and generate a second signal that is the first signal from which the noise signal is reduced, and
the control circuit determines at least one of the threshold voltage, the first period and a reduction range of the noise signal to be reduced from the first signal, based on the control signal and the second signal.

12. The electronic circuitry according to claim 11,
wherein the second filter includes
a delay circuit configured to delay the first signal and
an AND circuit configured to receive the first signal and the first signal delayed in the delay circuit and generate the second signal, and
the control circuit determines the reduction range of the noise signal by determining delay time of the delay circuit.

13. The electronic circuitry according to claim 11,
wherein the second filter includes
a resistor connected to the comparator circuit and
a second circuit for which a plurality of sets of third switches and second capacitors connected in series are connected in parallel, and
the control circuit determines the number of the third switches to be turned on in the second circuit.

14. The electronic circuitry according to claim 11,
wherein the control circuit determines one of the threshold voltage, the first period and the reduction range of the noise signal, based on a relation between a start time of the control signal and a start time of a pulse included in the second signal and a relation between an end time of the control signal and an end time of the pulse included in the second signal.

15. The electronic circuitry according to claim 14,
wherein the control circuit determines the first period when a difference between the start time of the pulse and the start time of the control signal is a threshold time or shorter.

16. The electronic circuitry according to claim 14,
wherein the control circuit determines the threshold voltage when the end time of the pulse is later than the end time of the control signal.

17. The electronic circuitry according to claim 14,
wherein the control circuit determines the reduction range of the noise signal when the difference between the start time of the pulse and the start time of the control signal is longer than the threshold time and the end time of the pulse is before the end time of the control signal.

18. The electronic circuitry according to claim 1,
wherein the first period includes at least a period until the semiconductor switching element is turned on after the first filter receives the control signal.

19. A method comprising:
acquiring a voltage of a first node via a detection circuit including a diode, a cathode side of the diode being connected to one end of a semiconductor switching element and an anode side of the diode being connected to a first node;

comparing a voltage of the first node and a threshold voltage and generating a first signal;

suppressing the voltage of the first node in a first period by a first filter based on a control signal indicating on of the semiconductor switching element; and determining at least one of the threshold voltage and the first period based on the first signal.

20. An electronic system comprising:
a plurality of pairs of semiconductor switching elements; and electronic circuitry corresponding to the plurality of pairs of semiconductor switching elements, wherein the electronic circuitry includes a detection circuit including a diode, a cathode side of the diode being connected to one end of a semiconductor switching element and an anode side of the diode being connected to a first node;

a comparator circuit configured to compare a voltage of the first node and a threshold voltage and generate a first signal;

a first filter configured to suppress the voltage of the first node in a first period based on a control signal indicating turn-on of the semiconductor switching element; and a control circuit configured to determine at least one of the threshold voltage and the first period based on the first signal, and an AC current is generated from a DC voltage by successively switching the pair of the semiconductor switching elements to be simultaneously turned on for at least a partial period of time.

21. A non-transitory computer readable medium having a computer program stored therein which when executed by a computer, causes the computer to perform process comprising:

supplying a control signal indicating turn-on of a semiconductor switching element to the semiconductor switching element;

receiving a first signal from a comparator circuit configured to compare a voltage of a first node connected to an anode side of a diode, a cathode side of the diode being connected to one end of the semiconductor switching element, and a threshold voltage and generate the first signal; and determining, based on the first signal, at least one of
the threshold voltage and
a first period during which a first filter connected between
the first node and the other end of the semiconductor
switching element suppresses the voltage of the first
node based on the control signal.

\* \* \* \* \*